(12) United States Patent
Kamiyama

(10) Patent No.: US 8,558,473 B2
(45) Date of Patent: Oct. 15, 2013

(54) LIGHT EMITTING DEVICE, LIGHT RECEIVING SYSTEM AND IMAGE PICKUP SYSTEM

(75) Inventor: Tomoyuki Kamiyama, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 268 days.

(21) Appl. No.: 13/124,891

(22) PCT Filed: Oct. 13, 2009

(86) PCT No.: PCT/JP2009/067721
§ 371 (c)(1),
(2), (4) Date: Apr. 19, 2011

(87) PCT Pub. No.: WO2010/047247
PCT Pub. Date: Apr. 29, 2010

(65) Prior Publication Data
US 2011/0199002 A1    Aug. 18, 2011

(30) Foreign Application Priority Data
Oct. 20, 2008   (JP) .................................. 2008-270225

(51) Int. Cl.
*H01S 5/00*    (2006.01)
*H01J 13/32*   (2006.01)

(52) U.S. Cl.
USPC .................. 315/246; 372/50.1; 372/50.12

(58) Field of Classification Search
USPC ............... 315/246; 372/43.01, 45.01, 45.011, 372/45.012, 8, 50.01, 50.12
See application file for complete search history.

(56) References Cited

U.S. PATENT DOCUMENTS

| 5,754,280 A | 5/1998 | Kato et al. |
| 6,636,538 B1 | 10/2003 | Stephens |
| 7,444,044 B2 * | 10/2008 | Klimek et al. .................. 385/18 |
| 2005/0069260 A1 * | 3/2005 | Klimek et al. .................. 385/50 |
| 2006/0192938 A1 * | 8/2006 | Kawahito ..................... 356/5.03 |

FOREIGN PATENT DOCUMENTS

| JP | 8-313215 | 11/1996 |
| JP | 2001-281336 | 10/2001 |
| JP | 2002-239733 | 8/2002 |
| JP | 2002-540640 | 11/2002 |
| JP | 2004-31433 | 1/2004 |
| JP | 2004-146456 | 5/2004 |

(Continued)

OTHER PUBLICATIONS

Ryohei Miyagawa et al., CCD-Based Range-Finding Sensor, IEEE Transactions on Electron Devices, vol. 44, No. 10, Oct. 1997, pp. 1648-1652.

(Continued)

*Primary Examiner* — Daniel D Chang
(74) *Attorney, Agent, or Firm* — Squire Sanders (US) LLP

(57) ABSTRACT

A light emitting device has: a dispersion light source wherein a plurality of semiconductor laser bars are arranged; and a drive circuit which makes the dispersion light source output at least one pulsed beam by supplying at least one drive pulse to the dispersion light source. In the dispersion light source, a plurality of semiconductor laser bars are arranged on a base, and furthermore, heat dissipating plates are arranged between the semiconductor laser bars. The pulse width of the pulsed beam outputted from the dispersion light source is longer than 1 femtosecond but shorter than 0.25 second, and the energy of the single pulsed beam is less than 66.8 μ[J].

12 Claims, 14 Drawing Sheets

(56) References Cited

FOREIGN PATENT DOCUMENTS

| | | |
|---|---|---|
| JP | 2004-294420 | 10/2004 |
| JP | 2005-208333 | 8/2005 |
| JP | 2007-507748 | 3/2007 |
| JP | 2008-226948 | 9/2008 |
| WO | 99/49358 | 9/1999 |
| WO | 2004/100331 | 11/2004 |

OTHER PUBLICATIONS

Koji Yamamoto et al., An Image Sensor with the Function for Detecting a Modulated Light Signal—Improvements of Image Characteristics captured by a Modulated Light—, Graduate School of Materials Science, Nara Institute of Science and Technology, vol. 27, No. 25, Mar. 2003, a total of 6 pages.

* cited by examiner

LIGHT EMITTING DEVICE, LIGHT RECEIVING SYSTEM AND IMAGE PICKUP SYSTEM

TECHNICAL FIELD

The present invention relates to a light-emitting device, which can be used in various applications that make use of light emission. The present invention also relates to a light-detecting system (light receiving system) and an image sensing system (image pickup system), which incorporate such a light-emitting device therein.

BACKGROUND ART

Applications that make use of light emission include an optical space transmission system and a rangefinding system.

One known rangefinding system, which measures a distance up to an object in a contactless manner, for example, employs a time-of-flight (TOF) process. According to the TOF process, light is emitted toward the object, and a period of time, which is consumed after the light has been emitted toward the object and until the light bounces off the object and returns, is measured, so that the distance up to the object can be measured based on the period of time and the velocity of light (see Japanese Laid-Open Patent Publication No. 2001-281336, Japanese Laid-Open Patent Publication No. 08-313215, and Documents 1 and 2 discussed below).

Document 1 contains a detailed explanation concerning the timing to emit pulsed lights and the operational timing of two light-detecting devices in a rangefinding system. More specifically, a pulsed light is emitted and not emitted repeatedly for identical periods (by a light-emitting device which is energized at a duty ratio of 50%), and the light-detecting device transfers photoelectrons alternately in two directions in synchronism with the pulsed light, which is emitted and not emitted (see FIG. 1 of Document 1). A period of time consumed until the pulsed light bounces off the object and returns is determined based on the difference between two output voltages of the light-detecting devices.

Document 2 discloses a light-modulation-detection image sensor for allocating photoelectrons made up of background and modulation light components, and photoelectrons made up of a modulation light component, respectively, to corresponding floating diffusions. In particular, Document 2 discloses a technology for reducing the effect of the diffusion carrier and the effect of residual photoelectrons.

Some rangefinding systems and optical space transmission systems employ light-emitting diodes as light-emitting devices. Other rangefinding systems and optical space transmission systems employ semiconductor lasers as light-emitting devices for high-speed optical transmission, and to enable highly accurate rangefinding operations.

When a semiconductor laser is used as a point light source, since it is necessary to take into account problems related to heat generation and power consumption thereof, the output power of the semiconductor laser needs to be reduced if the object is irradiated with continuous light from the point light source over a given period of time.

Reflected light from the object includes not only a signal light component based on the reflected laser beam, but also noise due to sunlight, and shot noise (a noise component of ambient light) of sunlight. If the output power of the semiconductor laser is reduced, as described above, then the noise component of ambient light becomes greater than the signal light component, resulting in a reduction in the S/N ratio. Inasmuch as the object is irradiated with continuous light over the given period (e.g., during one frame period), a time interval corresponding to the above given period needs to be provided between acquisition of a luminance value when the object is irradiated and acquisition of a luminance value when the object is not irradiated, thus making it impossible to achieve synchronism between acquisition of the luminance value when the object is irradiated and acquisition of the luminance value when the object is not irradiated. Therefore, even if a semiconductor laser is used simply as a light-emitting device, it is difficult for the semiconductor laser to be used in various applications that make use of light emission.

Document 1:
Ryohei Miyagawa and Takeo Kanade, "CCD-Based Range-Finding Sensor", IEEE Transactions on Electron Devices, Vol. 44, No. 10, October 1997, pp. 1648 through 1652.

Document 2:
Koji Yamamoto, Yu Oya, Keiichiro Kagawa, Jun Ohta, Masahiro Nunoshita, and Kunihiro Wanatabe, "An Image Sensor with the Function for Detecting a Modulated Light Signal: Improvement of Image Characteristics Captured by a Modulated Light", Technical Report from the Institute of Image Information and Television Engineers, Vol. 27, No. 25, Mar. 28, 2003, pp. 9 through 12.

SUMMARY OF INVENTION

The present invention has been made in view of the aforementioned problems. It is an object of the present invention to provide a light-emitting device, which is capable of reducing heat generation and power consumption as well as increasing the S/N ratio of signal light, and which can be used in various applications that make use of light emission.

Another object of the present invention is to provide a light-detecting system and an image sensing system, which incorporate therein the above light-emitting device, for reducing the effect of a noise component of ambient light, and for increasing synchronism between acquisition of a luminance value when an object is irradiated and acquisition of a luminance value when the object is not irradiated.

A light-emitting device according to a first invention comprises a diffused light source having a light emission surface, the longest side of which has a length of 1.5 mm or greater, and a drive circuit for supplying drive pulses to the diffused light source in response to a light emission command input thereto in a constant cyclic period, to enable the diffused light source to emit at least two pulsed lights intermittently, wherein the diffused light source comprises a plurality of semiconductor laser bars each having a linear array of light-emission regions, the semiconductor laser bars being stacked together, heat radiating plates interposed between the semiconductor laser bars, an anode terminal plate mounted on one of the semiconductor laser bars, which is positioned at one end of the diffused light source, and a cathode terminal plate mounted on one of the semiconductor laser bars, which is positioned at an opposite end of the diffused light source, and wherein the pulsed lights emitted from the diffused light source have a pulse duration longer than 1 nanosecond and shorter than 0.25 second, a single pulse of the pulsed lights has a light energy less than 66.8 µ[J], the constant cyclic period exceeds 18 µsec, the at least two pulsed lights make up a light pulse train having an average energy less than 3.75 µ[J], the pulsed lights have an average power less than 74.0 m[W], and the duty ratio of the pulsed lights to the constant cyclic period is 1% or less.

Since the light-emitting device is capable of producing pulsed lights of a short pulse duration, the light-emitting device can reduce heat generation and power consumption, as well as increase the S/N ratio of signal light. The light-emitting device can be used in various applications that make use of light emission.

The light-emitting device can keep the power of each light pulse contained in the light pulse train higher than continuous light, thereby greatly increasing the S/N ratio of the pulsed light (signal) to ambient light (noise) in each pulse duration.

Since the semiconductor laser bars simultaneously emit pulsed lights, the diffused light source can emit a bundle of pulsed lights, light intensities of which are substantially more uniform than if a light beam emitted from one spot light source were diffused by a light diffusing member, for thereby increasing the S/N ratio of the pulsed lights (signals) to ambient light (noise). Although heat generated by the semiconductor laser bars is a concern, since the semiconductor laser bars do not emit continuous light, but rather emit pulsed lights, and the pulse period of the light pulse train is set to a value longer than 18 μsec, heat generated thereby can sufficiently be radiated during periods in which the pulsed lights are not emitted.

Since each of the semiconductor laser bars is sandwiched between respective metal plates, the ability of the diffused light source to radiate heat is increased, so that the problem of accumulated heat due to emission of the light pulse train over an extended period of time can be solved.

In the first invention, the light emission surface of the diffused light source may be combined with a light diffusing member for controlling at least a range irradiated with light and/or a bright spot area of light emitted from the light-emitting device. The light diffusing member may comprise a diffusing plate with a hologram pattern formed thereon. The light diffusing member makes it possible to change an irradiation range at which the subject is irradiated with pulsed lights emitted from the diffused light source, an irradiation range required for optical space transmission, and a viewing angle through which the diffused light source can be viewed, etc., for thereby setting an irradiation range and a bright spot area, which are optimal depending on the application and installed position of the light-emitting device.

A light-detecting system according to a second invention comprises the above light-emitting device according to the first invention, for irradiating a subject with light, a light-detecting device for detecting reflected light from the subject, and a control device for controlling the light-emitting device and the light-detecting device. The light-detecting device comprises a photodetector for detecting the reflected light and generating photoelectrons by the detected reflected light, a first capacitor and a second capacitor for storing the photoelectrons from the photodetector, a photoelectron discharger for discharging the photoelectrons from the photodetector, and a first switching element, a second switching element, and a third switching element for selectively allocating the photoelectrons from the photodetector to the first capacitor, the second capacitor, and the photoelectron discharger in synchronization with driving of the light-emitting device. The control device turns on the first switching element to transfer the photoelectrons from the photodetector to the first capacitor during a first period that resides within a period in which the pulsed lights are not emitted from the light-emitting device, turns on the second switching element to transfer the photoelectrons from the photodetector to the second capacitor during a second period that resides within a period in which the pulsed lights are emitted from the light-emitting device, turns on the third switching element to discharge the photoelectrons from the photodetector to the photoelectron discharger during a period other than the first period and the second period, and acquires luminance information of the reflected light independent of ambient light, based on a difference between a photoelectron quantity transferred to the first capacitor and a photoelectron quantity transferred to the second capacitor.

By using the light-emitting device according to the first invention, the S/N ratio can be increased and the effect of noise components due to ambient light can be eliminated. In addition, synchronism between acquisition of a luminance value when the object is irradiated and acquisition of a luminance value when the object is not irradiated can be increased.

In the second invention, a combination of the first period and the second period may be intermittently repeated a plurality of times, the photoelectrons from the photodetector may be transferred to and stored in the first capacitor during the first period, which is repeated a plurality of times, the photoelectrons from the photodetector may be transferred to and stored in the second capacitor during the second period, which is repeated a plurality of times, and luminance information of the reflected light independent of ambient light may be acquired based on the difference between a photoelectron quantity transferred to and stored in the first capacitor and a photoelectron quantity transferred to and stored in the second capacitor.

Since the light-emitting device emits pulsed lights of a short pulse duration, it is possible to switch a plurality of times, within a short time, between reading of photoelectrons generated during a period in which the subject is irradiated with pulsed lights (acquisition of a luminance value at a time when the subject is irradiated) and reading of photoelectrons generated during a period in which the subject is not irradiated with pulsed lights (acquisition of a luminance value at a time when the subject is not irradiated). Thus, synchronism between acquisition of the luminance value when the object is irradiated and acquisition of the luminance value when the object is not irradiated is significantly increased. Furthermore, since the light-detecting system discharges photoelectrons during a period other than during acquisition of a luminance value at a time when the subject is irradiated and acquisition of a luminance value at a time when the subject is not irradiated, the light-detecting system can reduce the effect of ambient light, such as sunlight or the like.

In the second invention, the photodetector may comprise a photodiode, a pinned photodiode, or a photogate.

In the second invention, each of the first capacitor and the second capacitor may comprise a MIM capacitor, a MOS capacitor, or a parasitic capacitance of a pinned photodiode structure or a pn junction.

In the second invention, at least the first switching element, the second switching element, the third switching element, the first capacitor, and the second capacitor may be disposed in a light-shielded region.

In the second invention, the light-detecting system may further comprise a power supply and a resetting switch for resetting the potentials of the first capacitor and the second capacitor at a reset potential.

In the second invention, the light-detecting system may further comprise a first amplifier including a first gate terminal to which a potential based on the photoelectron quantity stored in the first capacitor is applied, wherein the first amplifier converts the potential applied to the first gate terminal into a voltage signal, and a second amplifier including a second gate terminal to which a second potential based on the photoelectron quantity stored in the second capacitor is applied, wherein the second amplifier converts the potential applied to the second gate terminal into a voltage signal.

An image sensing system according to a third invention comprises the above light-emitting device according to the first invention, and a line sensor array or a two-dimensional image sensor array including an array of pixels, wherein a unit, which includes at least the photodetector, the first capacitor, the second capacitor, the first switching element, and the second switching element of the light-detecting device of the light-detecting system according to the second invention, provides components of a pixel of the line sensor array or the two-dimensional image sensor array.

The light detected by the light-detecting device may have a wavelength, which is equal to or greater than 700 nm and less than 1050 nm. If infrared radiation is used, then the image sensing system can be realized as a night-vision image sensing system.

As described above, the light-emitting device according to the present invention is capable of reducing generation of heat and power consumption, and can increase the S/N ratio of signal light. Hence, the light-emitting device according to the present invention can be used in various applications that make use of light emission.

The light-detecting system and the image sensing system according to the present invention, which incorporate therein the above light-emitting device, are capable of increasing the S/N ratio, reducing the effect of noise components due to ambient light, and increasing synchronism between acquisition of a luminance value when the object is irradiated and acquisition of a luminance value when the object is not irradiated.

DESCRIPTION OF EMBODIMENTS

A light-emitting device, a light-detecting system, and an image sensing system according to an embodiment of the present invention will be described below with reference to FIGS. 1 through 14.

[Light-Emitting Device]

Figure 1:
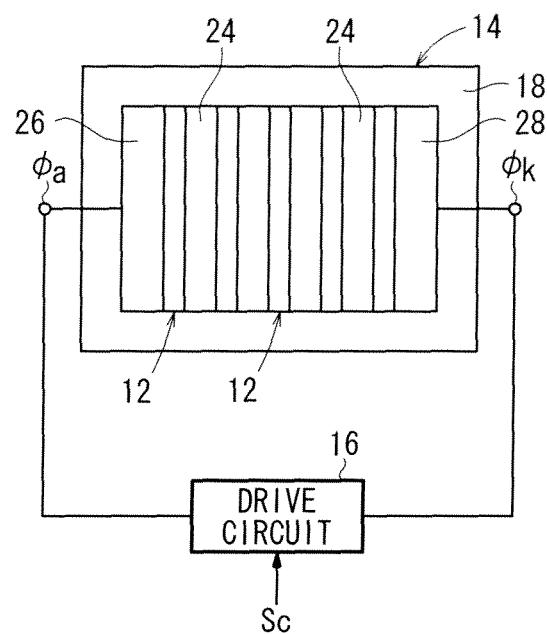
FIG. 1 is a view of a light-emitting device according to an embodiment of the present invention.

As shown in FIG. 1, a light-emitting device 10 according to an embodiment of the present invention comprises a diffused light source 14 including an array of semiconductor laser bars 12, and a drive circuit 16 for supplying a single drive pulse Pd (see FIG. 2) to the diffused light source 14 based on a light emission command Sc input thereto, so as to enable the diffused light source 14 to emit a single pulse of light. In FIG. 1, the diffused light source 14 includes an array of five semiconductor laser bars 12 having respective laser beam emission surfaces, all of which are exposed on one surface (light emission surface) of the diffused light source 14.

The semiconductor laser bars 12 of the diffused light source 14 are arranged with longitudinal axes thereof oriented horizontally and stacked along a direction that is perpendicular to the longitudinal axes. Alternatively, the semiconductor laser bars 12 are arranged with longitudinal axes thereof oriented vertically and aligned along a direction that is perpendicular to the longitudinal axes.

The diffused light source 14 also includes heat radiating plates 24 (heat sinks in the form of thin plates), which are interposed between the semiconductor laser bars 12. An anode terminal plate 26 having an anode terminal φa is mounted on the semiconductor laser bar 12, which is positioned at one end of the diffused light source 14, and a cathode terminal plate 28 having a cathode terminal φk is mounted on the semiconductor laser bar 12, which is positioned at an opposite end of the diffused light source 14.

Figure 2:
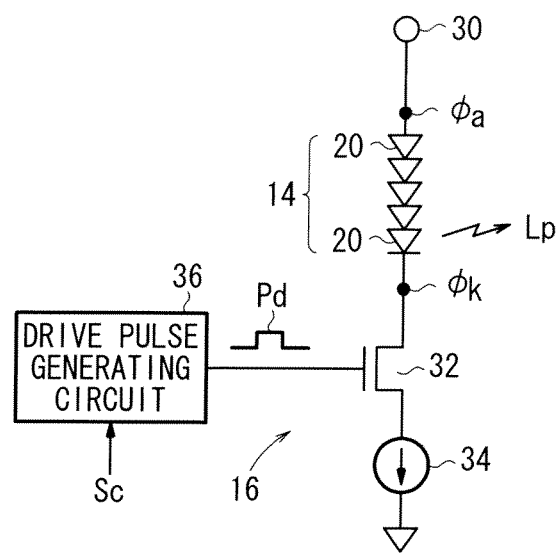
FIG. 2 is a circuit diagram showing an arrangement of the light-emitting device according to the present embodiment.

As shown in FIG. 2, the drive circuit 16 comprises a drive power supply 30 (a positive power supply) connected to the anode terminal φa, a switching device 32 connected to the cathode terminal φk and supplied with the drive pulse Pd, a constant current source 34 connected between the switching device 32 and ground (or a negative power supply), and a drive pulse generating circuit 36 for supplying the switching device 32 with the drive pulse Pd based on the light emission command Sc input thereto. The switching device 32 may comprise an n-channel MOS transistor or the like. If the switching device 32 comprises an n-channel MOS transistor, then the cathode terminal φk of the diffused light source 14 is connected to the drain terminal of the transistor, and the constant current source 34 is connected to the source terminal of the transistor. Since the diffused light source 14 comprises a circuit arrangement including a plurality of series-connected semiconductor laser bars 12 disposed between the anode terminal φa and the cathode terminal φk, the constant current source 34 is connected in order to supply a stable current to the semiconductor laser bars 12.

The switching device 32 is turned on when the drive pulse Pd is supplied to the switching device 32 of the drive circuit 16. While the switching device 32 is energized, current flows from the anode terminal φa to the cathode terminal φk of the diffused light source 14, thus enabling the semiconductor laser bars 12 to emit light simultaneously. The lights emitted respectively from the semiconductor laser bars 12 are combined into a single pulsed light Lp having a prescribed bright spot area. The bright spot area is represented by an area of a region (which is square or rectangular in shape) surrounded by an outermost one of the semiconductor laser bars 12.

When the light emission command Sc is input to the drive pulse generating circuit 36 during a certain cyclic period, the drive pulse generating circuit 36 supplies the drive pulse Pd to the switching device 32 during the certain cyclic period, thereby enabling the diffused light source 14 to emit the pulsed light Lp as a light pulse train in timed relation to the drive pulse Pd. The certain cyclic period referred to above represents a pulse period of the light pulse train.

Ranges of various parameters of the diffused light source 14 according to the present embodiment will be described below.

(1) Among the sides of a region (which may be square or rectangular in shape) surrounded by an outermost one of the semiconductor laser bars 12, the longest side is 1.5 mm or greater. The semiconductor laser bars 12 are thus regarded as the diffused light source 14.

(2) The light emitted from the diffused light source 14 has a wavelength, which is equal to or greater than 700 nm and less than 1050 nm.

(3) The pulse period of the light pulse train exceeds 18 μsec.

(4) The pulsed light Lp has a pulse duration, which is longer than 1 nanosecond and shorter than 0.25 second.

(5) The duty ratio of the pulsed light to the certain cyclic period (pulse period) is 1% or less, and more preferably, 0.1% or less.

In order to determine upper limits for the energy of a single pulse of the pulsed light Lp emitted from the diffused light source 14 according to the present embodiment, the average energy of the light pulse train (the energy of continuous light), and the average power (including periods in which the pulsed light Lp is quiescent), it is assumed that the size of the light source is d=10 mm, the wavelength of light is λ=1050 nm, the maximum viewing angle is αmax=100 m [rad], the minimum viewing angle is αmin=1.5 m [rad], and the number of pulses per 100 seconds is N=100 k.

The above energies are measured by calculating a measurement distance r according to the calculation process defined below, and by limiting the laser beam that passes through a circular aperture having a diameter of 7 mm, which is disposed at the measurement distance r, to an acceptance angle of 100 m [rad] in order to focus the laser beam.

(Calculation of Measurement Distance r)

$$r=100\times[(\alpha \times 0.46 \text{ m rad})/\alpha max] \text{ [mm]}$$

The measurement distance r is determined using the arithmetic mean of two viewing angles taken with respect to vertical and horizontal sides of a square or linear light source.

Viewing angle α=d/100 mm [rad]

If the viewing angle α>αmax, then r=100 mm.

<Energy of Single Pulse of Pulsed Light Lp>

The energy (AELsingl) of the single pulse of the pulsed light Lp is determined according to the following equation (1):

$$AELsingl=2\times10^{-7}\times C4\times C6 \quad (1)$$

where C4 represents an infrared-ray-wavelength-dependent coefficient (dependent on wavelength), and C6 represents a diffused-light-source-relaxation constant (dependent on viewing angle). C4 and C6 are determined according to the following equations:

$$C4 = 10^{0.002} \times (\lambda - 700)$$
$$= 10^{0.002} \times (1050 - 700)$$
$$= 5.01$$

$$C6 = \alpha / \alpha min$$
$$= (10 \text{ mm}/100 \text{ mm}) \text{ [rad]}/1.5 \text{ m[rad]}$$
$$= 66.7$$

Therefore, an upper limit for the single pulse of the pulsed light Lp is calculated as AELsingl=66.8 μ[J] according to the above equation (1). According to the present embodiment, the energy of the single pulse of the pulsed light Lp is less than 66.8 μ[J].

<Average Energy of Light Pulse Train>

The average energy of the light pulse train (AELav.) is determined according to the following equation (2):

$$AELav.=AELsingl \times C5 \quad (2)$$

where C5 is determined according to the following equation:

$$C5 = N^{-0.25}$$
$$= 100 \text{ k [pulses]}^{-0.25}$$
$$= 0.0562$$

Therefore, an upper limit for the average energy of the light pulse train is calculated as AELav.=3.75 μ[J] according to the above equation (2). According to the present embodiment, the average energy of the light pulse train is less than 3.75 μ[J].

<Average Power>

The average power (AEL) is determined according to the following equation (3):

$$AEL=7\times10^{-4}\times C4\times C6\times T2^{-0.25} \quad (3)$$

where T represents a viewing-angle-dependent time (dependent on viewing angle), which is determined according to the following equation:

$$T2=10\times10^{CA}(CA=[(\alpha-\alpha min)/98.5])$$

$$T2=100$$

Therefore, an upper limit for the average power is AEL=74.0 m [W] according to the above equation (3). According to the present embodiment, the average power is less than 74.0 m [W].

The light-emitting device 10 according to the present embodiment, which is constructed as described above, is capable of producing a pulsed light Lp having a short pulse duration. Consequently, the light-emitting device 10 is capable of reducing generation of heat and power consumption, while increasing the S/N ratio of the signal light. The light-emitting device 10 can thus be used in various applications that make use of light emission (a single pulse of the pulsed light Lp or a light pulse train).

Furthermore, since the duty ratio of the pulsed light Lp to the certain cyclic period (pulse period of the light pulse train) is 1% or less, and more preferably, 0.1% or less, it is possible to keep the power of each light pulse of the pulsed light Lp contained within the light pulse train higher than that of continuous light, thereby greatly increasing the S/N ratio of the pulsed light Lp (signal) to ambient light (noise) that occurs within each pulse duration.

In the above embodiment, the light emission surface of the diffused light source 14 may be combined with a light diffusing member (not shown) for controlling at least the range of light irradiated and/or the bright spot area of light emitted from the light-emitting device 10. The light diffusing member should preferably comprise a diffusing plate with a hologram pattern formed thereon. The light diffusing member makes it possible to change an irradiation range at which the subject is irradiated with pulsed lights Lp emitted from the diffused light source 14, as well as to change an irradiation range required for optical space transmission, and a viewing angle through which the diffused light source is viewed, etc. Consequently, an irradiation range and a bright spot area can be set, which are optimal depending on the application and installed position of the light-emitting device 10.

Since the semiconductor laser bars 12 of the diffused light source 14 according to the present embodiment simultaneously emit pulsed lights Lp, the diffused light source 14 can emit a bundle of pulsed lights, the light intensities of which are substantially more uniform than if a light beam emitted from a single spot light source were diffused by the light diffusing member, for thereby increasing the S/N ratio of the pulsed lights Lp (signal) to ambient light (noise). Although there is concern with respect to heat generated by the semiconductor laser bars 12, since the semiconductor laser bars 12 do not emit continuous light, but rather emit the pulsed lights Lp, and the pulse period of the light pulse train is set to a value longer than 18 μsec. in order to make the duty ratio of the pulsed lights Lp to the pulse period equal to or less than 1%, the generated heat can sufficiently be radiated during periods in which the pulsed lights Lp are not emitted.

According to the present embodiment, the heat radiating plates 24 are interposed between the semiconductor laser bars 12, the anode terminal plate 26 is mounted on the semiconductor laser bar 12, which is positioned at one end of the array of semiconductor laser bars 12, and the cathode terminal plate 28 is mounted on the semiconductor laser bar 12, which is positioned at an opposite end of the array of semiconductor laser bars 12. Therefore, the semiconductor laser bars 12 are sandwiched between the metal plates, and the ability of the diffused light source 14 to radiate heat is increased, thereby solving the problem of accumulated heat caused by emission of the light pulse train over an extended period of time.

[Light-Detecting System 100]

A light-detecting system 100 that incorporates the light-emitting device 10 therein will be described below with reference to FIGS. 3 through 14.

Figure 3:
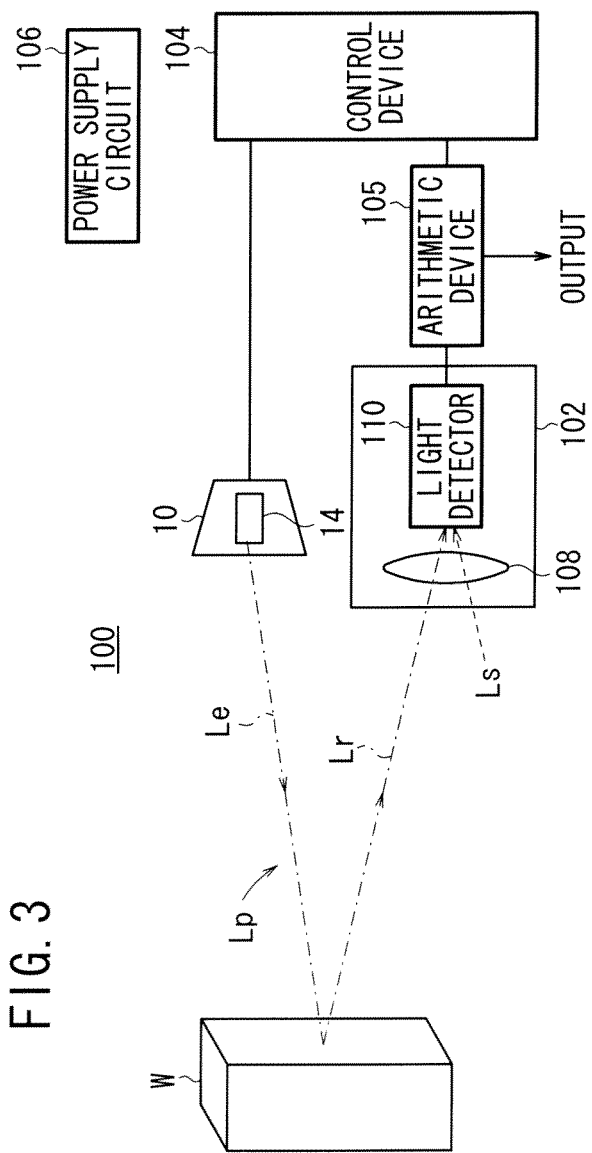
FIG. 3 is a diagram showing a light-detecting device according to the present embodiment.

As shown in FIG. 3, the light-detecting system 100 according to the present embodiment includes the light-emitting device 10 described above, a light-detecting device 102, a control device 104, an arithmetic device 105, and a power supply circuit 106 for supplying a prescribed power supply voltage to the light-emitting device 10, the light-detecting device 102, the control device 104, and the arithmetic device 105. For the sake of brevity, power supply lines extending from the power supply circuit 106 to each of the devices are omitted from illustration.

In the light-detecting system 100, the diffused light source 14 of the light-emitting device 10 emits a pulsed light Lp. The pulsed light Lp is reflected by an object W and enters the light-detecting device 102. Ambient light Ls such as sunlight, etc., also enters the light-detecting device 102. For illustrative purposes, a pulsed light Lp that travels from the light-emitting device 10 to the object W will be referred to as "emitted light Le", whereas a pulsed light Lp that travels from the object W to the light-detecting device 102 will be referred to as "reflected light Lr".

The control device 104 removes ambient light Ls from the light detected by the light-detecting device 102, so as to acquire the reflected light Lr from the subject W.

Basic principles for reducing the effect of ambient light Ls, in particular, basic principles in the case that continuous light is used, will be described below with reference to FIGS. 4 through 6.

Figure 4:
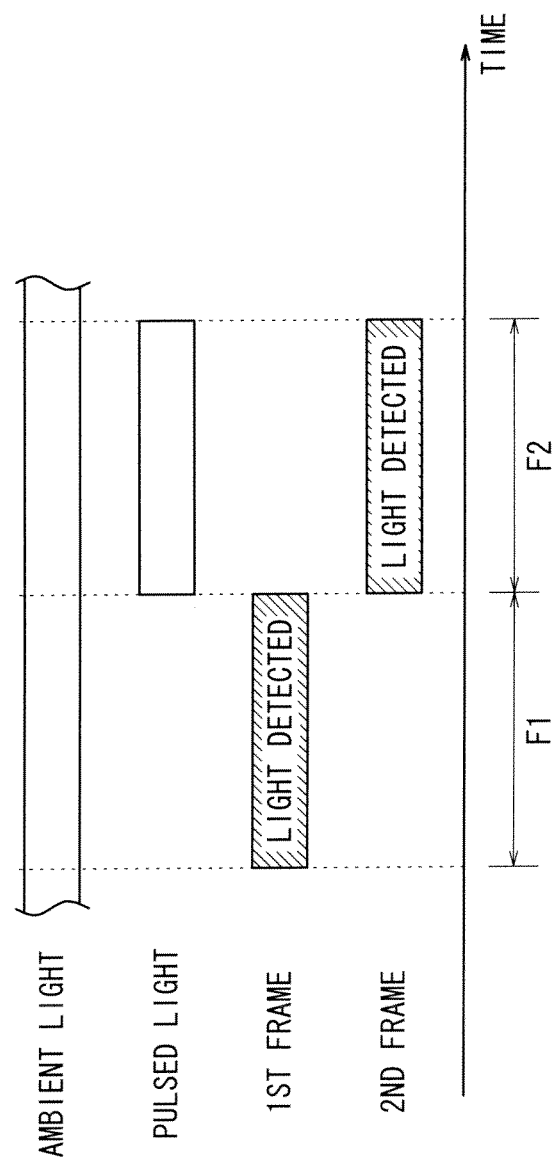
FIG. 4 is a timing chart showing the basic principle of a process for reducing the effect of ambient light.

As shown in FIG. 4, during a first frame period F1, photoelectrons generated when the subject W is not irradiated with continuous light are read, and a luminance value at a time when the subject W is not irradiated with continuous light is obtained from the photoelectrons. During a subsequent second frame period F2, photoelectrons generated when the subject W is irradiated with continuous light are read, and a luminance value at a time when the subject W is irradiated with continuous light is obtained from the photoelectrons. The effect of ambient light Ls (primarily a sunlight component) can be reduced by determining and acquiring a difference between the obtained luminance values. If the combination of the first frame period F1 and the second frame period F2 is regarded as one cycle, then the duty ratio of the continuous light in one cycle is 50%. Each frame period is ⅟60 [second], for example, which is the same as each image sensing period of the image sensing device.

During the first frame period F1, light is detected while continuous light is not being emitted. During the second frame period F1, light is detected while continuous light is emitted. Therefore, a noise component due to ambient light is read during the first frame period F1 as well as during the second frame period F1.

Figure 5:
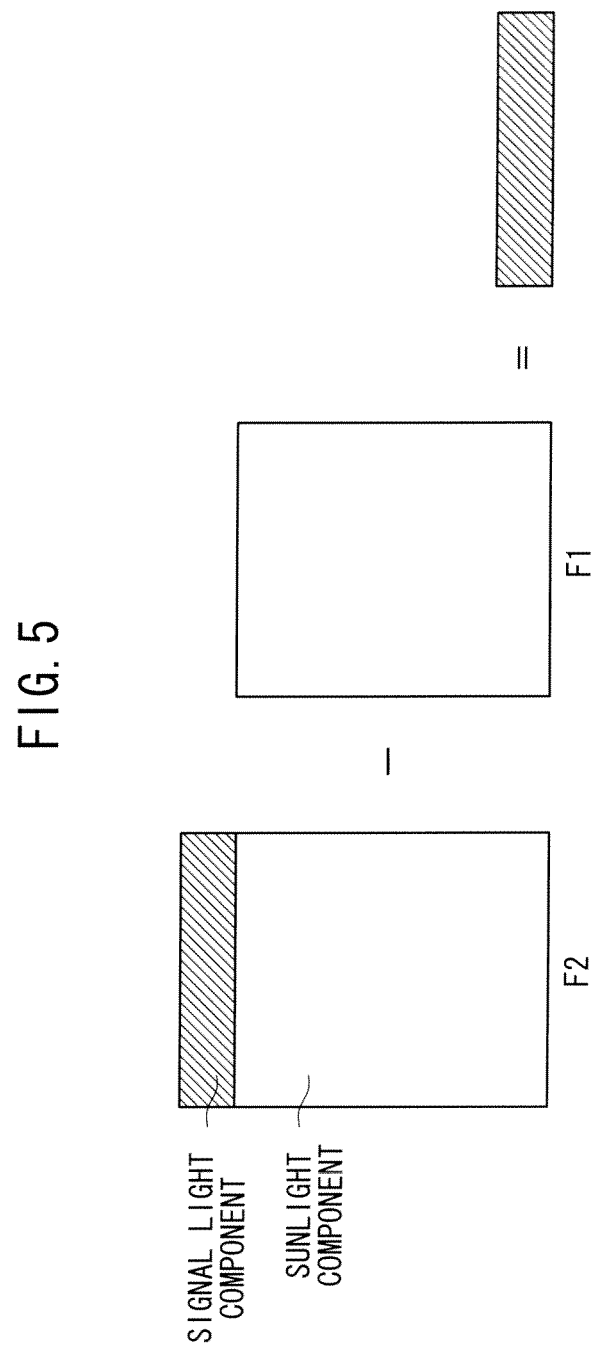
FIG. 5 is a diagram showing the basic principle of the process for reducing the effect of ambient light.
Figure 6:
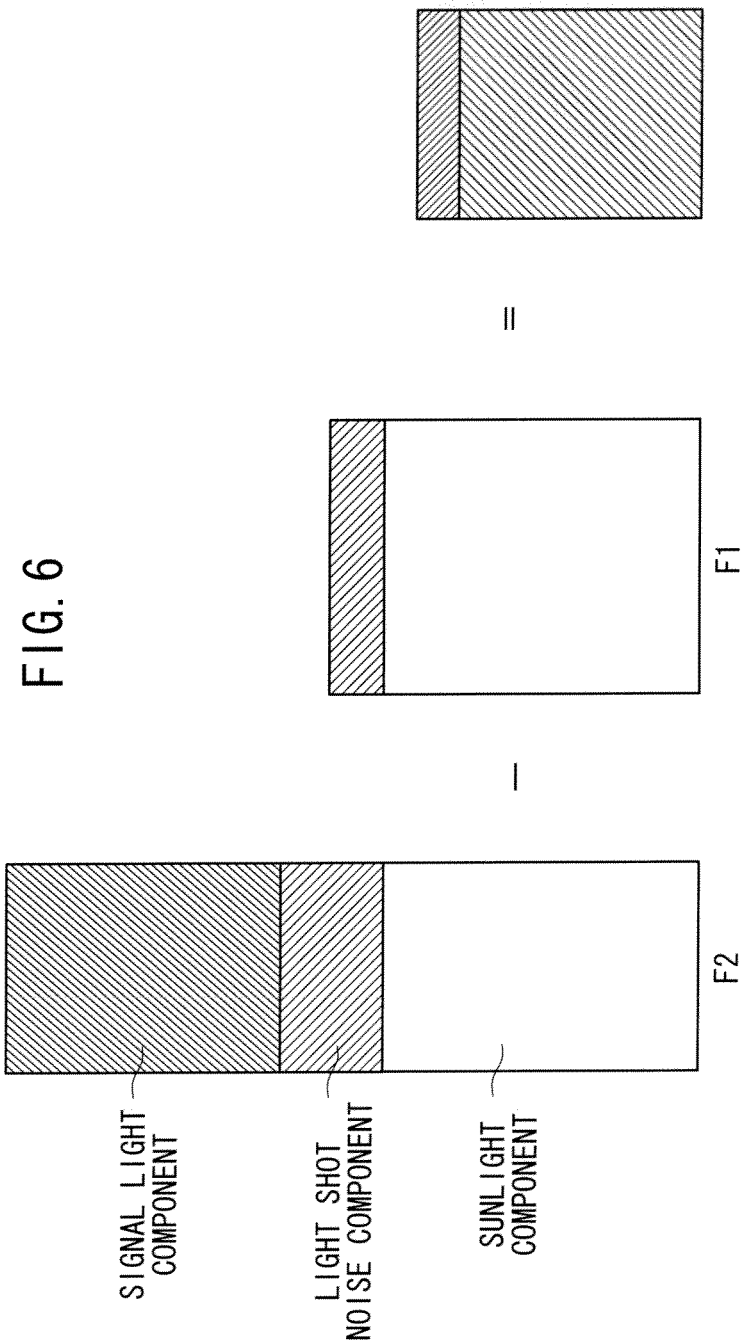
FIG. 6 is a diagram showing the effect of light shot noise from sunlight.

As shown in FIG. 5, when the luminance value (sunlight component) during the first frame period F1 is subtracted from the luminance value (signal light component+sunlight component) during the second frame period F2, the effect of the sunlight component is removed, and only the signal light component is obtained.

However, in an environment containing intensive ambient light such as sunlight, since there is an effect of light shot noise, and further because such light shot noise tends to be random, the effect of ambient light cannot sufficiently be removed simply by calculating the difference between the respective luminance values. More specifically, as shown in FIG. 6, if a light shot noise component generated during the first frame period F1 and a light shot noise component generated during the second frame period F2 are different from each other, then the difference between the light shot noise components becomes added to the signal light component.

Furthermore, in an environment containing intensive ambient light such as sunlight, since the sunlight component is greater than the signal light component (i.e., since the S/N ratio of the signal light component is low), the input dynamic range of the signal light component is reduced. The S/N ratio of the signal light component may be increased by repeating the first frame period F1 and the second frame period F2 in combination a plurality of times in order to accumulate the signal light component. However, inasmuch as random light shot noise is included in each frame period and remains partially unremoved when the difference between the luminance values is calculated, the remaining noise component tends to accumulate as the signal light component is accumulated, resulting in a reduction in the S/N ratio after the difference between the luminance values is calculated.

The S/N ratio of the signal light component may also be increased by increasing the power of the continuous light. However, continued emission of the continuous light during one frame period generates increased heat and also increases power consumption. Although the increase in heat may be dissipated by using a separate cooling mechanism, a light-detecting system having such a separate cooling mechanism is costly to manufacture, requires a high running cost, and is large in size. Therefore, there is a certain limitation on efforts to increase the power of the continuous light.

The light-emitting device 10 according to the present embodiment emits pulsed lights Lp of a short pulse duration from the diffused light source 14. Consequently, the light-detecting system 100, which incorporates the light-emitting device 10 therein, is capable of solving the above problems that arise as a result of using continuous light.

[Details of Light-Detecting System 100]

Details of the light-detecting system 100, which incorporates therein the light-emitting device 10 according to the present embodiment, will be described below with reference to FIGS. 7 through 14.

<Light-Detecting Device 102>

As shown in FIG. 3, the light-detecting device 102 comprises a lens 108 and a light detector 110. Reflected light Lr and ambient light Ls that have passed through the lens 108 are focused thereby onto the light detector 110.

Figure 7:
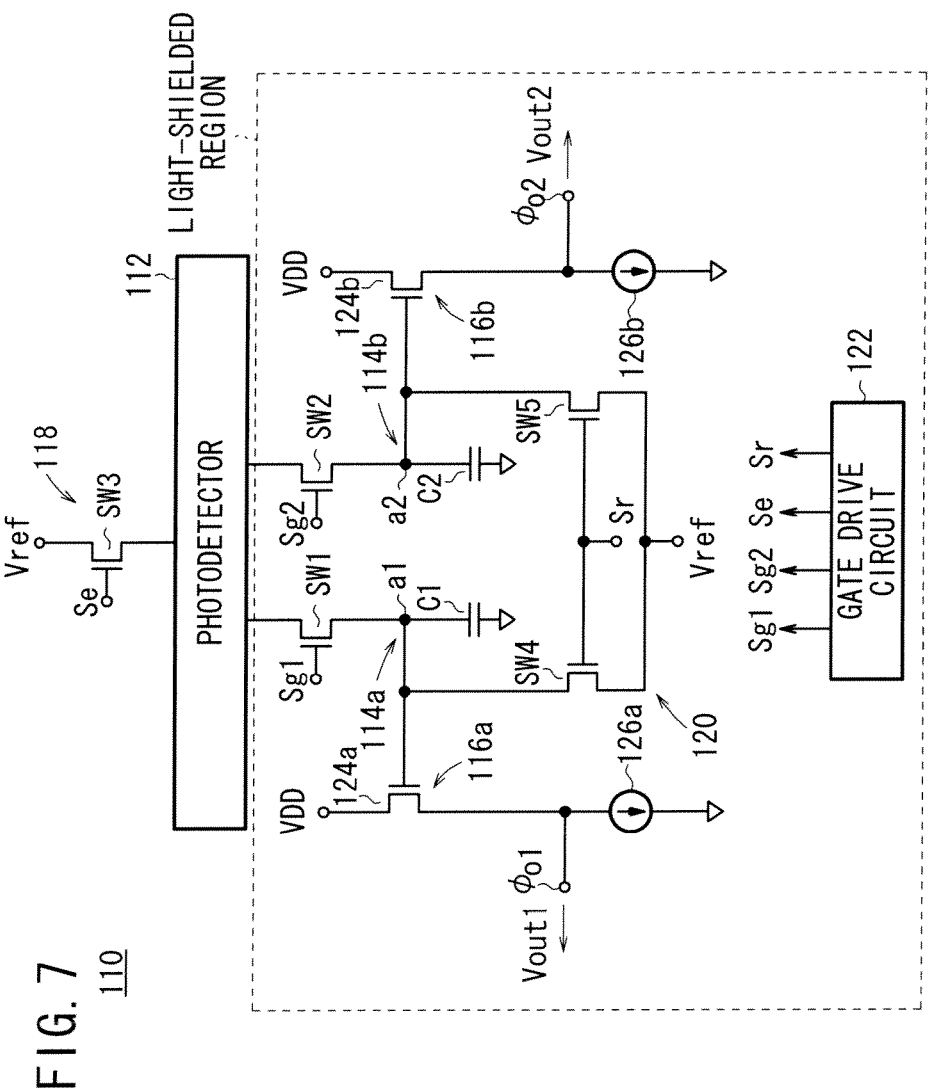
FIG. 7 is a circuit diagram showing the arrangement of a photodetector having a single photodetector.

(i) Light Detector 110:

As shown in FIG. 7, the light detector 110 comprises a photodetector 112, a first photoelectron storage unit 114a, a second photoelectron storage unit 114b, a first amplifier 116a, a second amplifier 116b, a photoelectron discharger 118, a resetting section 120, and a gate drive circuit 122.

(ii) Photodetector 112:

The photodetector 112 comprises a pinned photodiode, which generates photoelectrons depending on the amount of reflected light Lr. Alternatively, the photodetector 112 may comprise a different type of photodetector, such as a photodiode other than a pinned photodiode, a photogate, or the like.

(iii) First Photoelectron Storage Unit 114a and Second Photoelectron Storage Unit 114b:

The first photoelectron storage unit 114a comprises a first switching element SW1 and a first capacitor C1. The second photoelectron storage unit 114b comprises a second switching element SW2 and a second capacitor C2. Each of the first switching element SW1 and the second switching element SW2 may comprise an n-channel MOS transistor, respectively.

The first switching element SW1 and the second switching element SW2 select to which of the first photoelectron storage unit 114a and the second photoelectron storage unit 114b the photoelectrons generated by the photodetector 112 are supplied to. More specifically, the first switching element SW1 has a source connected to the photodetector 112, a drain connected to the first capacitor C1, and a gate connected to the gate drive circuit 122. Similarly, the second switching element SW2 has a source connected to the photodetector 112, a drain connected to the second capacitor C2, and a gate connected to the gate drive circuit 122. In response to gate drive signals (i.e., a first read signal Sg1 and a second read signal Sg2), which are supplied to the gates from the gate drive circuit 122, the first switching element SW1 and the second switching element SW2 are selectively turned on and off, so as to allocate the photoelectrons generated by the photodetector 112 to either one of the first photoelectron storage unit 114a and the second photoelectron storage unit 114b. For example, when the first switching element SW1 is turned on, the photoelectrons generated by the photodetector 112 are supplied to the first photoelectron storage unit 114a. According to the present embodiment, as described later, if both the first switching element SW1 and the second switching element SW2 are turned off, then unwanted photoelectrons generated by the photodetector 112 are discharged from the photoelectron discharger 118.

When the first switching element SW1 is turned on, the first capacitor C1 stores photoelectrons generated by the photodetector 112. Similarly, when the second switching element SW2 is turned on, the second capacitor C2 stores photoelectrons generated by the photodetector 112.

Each of the first capacitor C1 and the second capacitor C2 may comprise a MIM capacitor, a MOS capacitor, or a parasitic capacitance made up of a pinned photodiode structure or a pn junction.

(iv) First Amplifier 116a and Second Amplifier 116b:

The first amplifier 116a includes a first output element 124a comprising an n-channel MOS transistor, for example. The first output element 124a has a gate connected to a junctional between the first switching element SW1 and the first capacitor C1, a drain that is supplied with a power supply voltage VDD, and a source connected to ground (or to a negative power supply) through a first current source 126a. The source of the first output element 124a also is connected to a first output terminal φo1 from which a first output voltage Vout1 is produced. A voltage, which is dependent on the photoelectrons (photoelectron quantity Q1) stored in the first capacitor C1, is amplified by the first output element 124a, and the amplified voltage is produced as the first output voltage Vout1 from the first output terminal φo1.

Likewise, the second amplifier 116b includes a second output element 124b comprising an n-channel MOS transistor, for example. The second output element 124b has a gate connected to a junction a2 between the second switching element SW2 and the second capacitor C2, a drain that is supplied with the power supply voltage VDD, and a source connected to ground (or to a negative power supply) through a second current source 126b. The source of the second output element 124b also is connected to a second output terminal φo2 from which a second output voltage Vout2 is produced. A voltage, which is dependent on the photoelectrons (photoelectron quantity Q2) stored in the second capacitor C2, is amplified by the second output element 124b, and the amplified voltage is produced as the second output voltage Vout2 from the second output terminal φo2.

(v) Photoelectron Discharger 118:

The photoelectron discharger 118 comprises a third switching element SW3 for discharging photoelectrons. The third switching element SW3 discharges photoelectrons when both the first switching element SW1 and the second switching element SW2 are turned off (i.e., when the photoelectrons generated by the photodetector 112 are not allocated to the first photoelectron storage unit 114a and the second photoelectron storage unit 114b). The third switching element SW3 comprises a source connected to the photodetector 112, a drain supplied with a resetting voltage Vref, and a gate connected to the gate drive circuit 122. When the gate drive circuit 122 applies a gate drive signal (photoelectron discharge signal Se) to the gate (i.e., when the gate drive circuit 122 applies a high-level voltage to the gate), the gate is turned on in order to discharge photoelectrons generated by the photodetector 112 without allocating the photoelectrons to the first photoelectron storage unit 114a and the second photoelectron storage unit 114b. Therefore, the first photoelectron storage unit 114a and the second photoelectron storage unit 114b are selectively supplied with photoelectrons, which are generated by the photodetector 112, only during a period in which the gate of either one of the first switching element SW1 and the second switching element SW2 is turned on.

(vi) Resetting Section 120:

The resetting section 120 comprises a fourth switching element SW4 and a fifth switching element SW5, each of which comprises an n-channel MOS transistor, for example. The fourth switching element SW4 and the fifth switching element SW5 operate in ganged relation in order to discharge photoelectrons stored in the first capacitor C1 and the second capacitor C2, and to reset the potentials of the first capacitor C1 and the second capacitor C2 at a constant reset potential, thereby resetting the first capacitor C1 and the second capacitor C2.

More specifically, the fourth switching element SW4 has a source connected to the junctional between the first switching element SW1 and the first capacitor C1. The fifth switching element SW5 has a source connected to the junction a2 between the second switching element SW2 and the second capacitor C2. The fourth switching element SW4 and the fifth switching element SW5 have respective drains supplied with the resetting voltage Vref, and respective gates connected to the gate drive circuit 122. When the gate drive circuit 122 applies a gate drive signal (resetting signal Sr) to the gates, the fourth switching element SW4 and the fifth switching element SW5 discharge photoelectrons stored in the first capacitor C1 and the second capacitor C2, thereby resetting the first capacitor C1 and the second capacitor C2.

Figure 8:
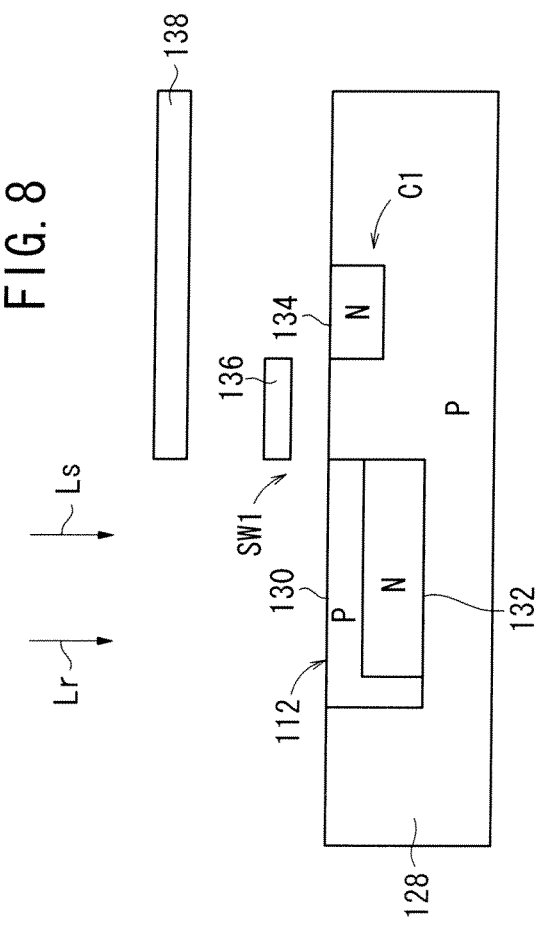
FIG. 8 is a cross-sectional view of the photodetector, which employs a pinned photodiode as the photodetector.

(vii) Structural Example of Photodetector 112:

FIG. 8 is a partial vertical cross-sectional view showing the photodetector 112, which comprises a pinned photodiode, and a peripheral structure thereof.

As shown in FIG. 8, the photodetector 112 and a peripheral structure thereof include a substrate 128 of a first conductivity type (e.g., P-type), a highly doped P-type first semiconductor region 130, a second semiconductor region 132 of a second conductivity type (e.g., N-type), an N-type third semiconductor region 134, a transfer gate 136 in the form of a polysilicon layer, and a light shield 138 in the form of a metal layer or the like.

An entire upper surface of the first semiconductor region 130 is exposed outwardly for receiving reflected light Lr and ambient light Ls. In the present embodiment, the first semiconductor region 130 and the second semiconductor region 132 jointly make up the photodetector 112.

The substrate 128, the second semiconductor region 132, the third semiconductor region 134, and the transfer gate 136 jointly make up the first switching element SW1 (the second switching element SW2 is omitted from illustration). The third semiconductor region 134 also functions as a floating diffusion, and makes up the first capacitor C1 according to the present embodiment (the second capacitor C2 is omitted from illustration).

The light shield 138 is disposed in covering relation to the upper surface of the third semiconductor region 134 and the transfer gate 136, for thereby blocking reflected light Lr and ambient light Ls from entering into the third semiconductor region 134 and the transfer gate 136.

<Operation of Light-Detecting System 100>

Operation of the light-detecting system 100 according to the present embodiment will be described below with reference to FIGS. 9 and 10.

Figure 9:
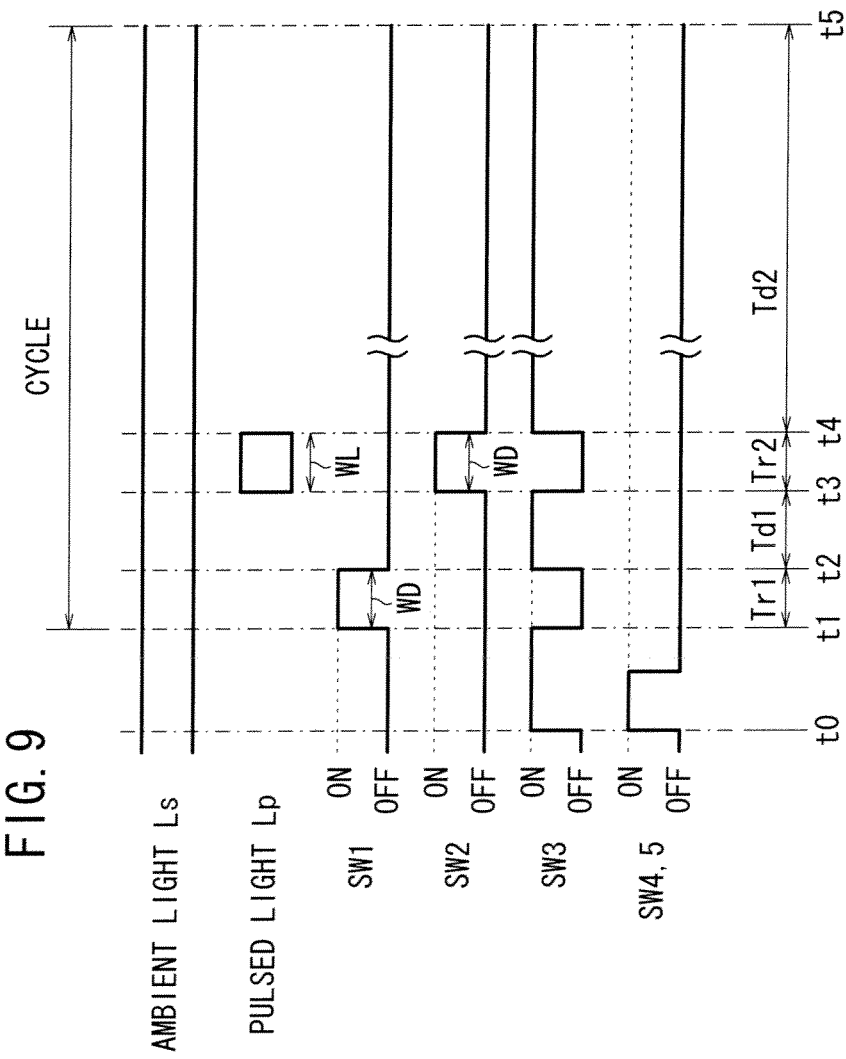
FIG. 9 is a timing chart of an operation sequence, for one cycle, of the light-detecting system according to the present embodiment.

As shown in FIG. 9, the light-emitting device 10 emits a pulsed light Lp for an emission time WL. The first switching element SW1 and the second switching element SW2 are turned on during respective periods WD, which are identical to each other.

The first switching element SW1 and the second switching element SW2 allocate the photoelectrons generated by the photodetector 112 to the first capacitor C1 and to the second capacitor C2. The photoelectrons transferred to the first capacitor C1 are photoelectrons (photoelectron quantity Q1) generated by the photodetector 112 from incident ambient light Ls, and the photoelectrons transferred to the second capacitor C2 are photoelectrons (photoelectron quantity Q2) generated by the photodetector 112 from incident ambient light Ls and reflected light Lr (reflected light produced when the pulsed light Lp is reflected by the subject W).

As indicated by equation (4) below, information concerning the intensity of the reflected light, which is independent of ambient light, can be acquired by calculating the difference between the photoelectron quantity Q1 and the photoelectron quantity Q2.

$$\text{Reflected light intensity} = Q2 - Q1 \quad (4)$$

Photoelectrons that are generated when both the first switching element SW1 and the second switching element SW2 are not turned on (i.e., when both are turned off) are unwanted photoelectrons. By turning on the third switching element SW3, such unwanted photoelectrons are discharged to the drain of the third switching element SW3.

Detailed operational timing of the light-detecting system 100 will be described below with reference to FIGS. 9 and 10.

Initially, the light-detecting system 100 is initialized by turning on all of the third through fifth switching elements SW5, while turning off the first switching element SW1 and the second switching element SW2, at time t0. Unwanted photoelectrons stored in the photodetector 112 then are discharged, and potentials of the first capacitor C1 and the second capacitor C2 are reset at a reset potential.

After the light-detecting system 100 has been initialized, a cycle for acquiring a reflected light intensity is performed once or is repeated a plurality of times.

In this cycle, the first switching element SW1 is turned on (while the second switching element SW2 remains turned off), from time t1 and for a first read period Tr1 in which the pulsed light Lp is not emitted. During this time, photoelectrons (a photoelectron quantity Q1) generated from ambient light Ls by the photodetector 112 are transferred to the first capacitor C1. During a period from time t1 at the start of the first read period Tr1 until the first capacitor C1 is reset, a voltage depending on the photoelectrons (the photoelectron quantity Q1) stored in the first capacitor C1 is amplified by the first output element 124a, and the amplified voltage is produced as the first output voltage Vout1 from the first output terminal φo1 of the first amplifier 116a.

For a first discharge period Td1 from time t2, upon elapse of the first read period Tr1, the first switching element SW1 is turned off while simultaneously the third switching element SW3 is turned on. At this time, unwanted photoelectrons generated by the photodetector 112 in the first discharge period Td1 are discharged.

Upon elapse of the first discharge period Td1, i.e., at time t3, the control device 104 outputs a light emission command Sc to the drive pulse generating circuit 36 (see FIG. 2) of the light-emitting device 10, thereby enabling the diffused light source 14 to emit a single light pulse Lp. At time t3, for a second read period Tr2 from time t3, the third switching element SW3 is turned off, and the second switching element SW2 is turned on (the first switching element SW1 remains turned off). At this time, photoelectrons (photoelectron quantity Q2), which are generated by the photodetector 112 from ambient light Ls and reflected light Lr, are transferred to the second capacitor C2. The second switching element SW2 is turned off at time t4 upon elapse of the second read period Td2. During a period from time t3 at the start of the second read period Tr2 and until the second capacitor C2 is reset, a voltage dependent on the photoelectrons (photoelectron quantity Q2) stored in the second capacitor C2 is amplified by the second output element 124b, and the amplified voltage is produced as a second output voltage Vout2 from the second output terminal φo2 of the second amplifier 116b.

Thereafter, the third switching element SW3 is turned on for a second discharge period Td2 from time t4, upon elapse of the second read period Tr2, to time t5 at the end of the cycle. At this time, unwanted photoelectrons generated by the photodetector 112 in the second discharge period Td2 are discharged. The cycle is brought to an end at time t5 at the end of the second discharge period Td2.

If the above cycle is performed only once, then the cycle may be completed at a time when one frame period has elapsed from time t1. In this case, the first output voltage Vout1 may be read as first numerical data D1 at any desired time after time t2 upon elapse of the first read period Tr1, whereas the second output voltage Vout2 may be read as second numerical data D2 at any desired time after time t4 upon elapse of the second read period Tr2. Reflected light intensity data Dr are calculated according to the following equation (5):

$$Dr = D2 - D1 \qquad (5)$$

The first output voltage Vout1 and the second output voltage Vout2 may be read simultaneously as first numerical data D1 and second numerical data D2, respectively, at any time after time t4 upon elapse of the second read period Tr2. The reflected light intensity data Dr may be calculated according to the above equation (5).

Thereafter, the fourth switching element SW4 and the fifth switching element SW5 are turned on from time tr after the second output voltage Vout2 is read, thereby discharging the photoelectron quantities Q1 and Q2 stored in the first capacitor C1 and the second capacitor C2.

With the above light-emitting device 10, the pulse duration of the pulsed light Lp is longer than 1 nanosecond and shorter than 0.25 second. Therefore, if the above cycle is performed only once, the pulse duration of the pulsed light Lp can be set to a value equal to or less than 1% of one frame period, for example, a time length equal to or less than 0.1% of one frame period. Since the pulse duration can be set to a very short value, the power of one light pulse of the pulsed light Lp can be increased, thereby resulting in an increase in the S/N ratio of the reflected light component (signal line) to the ambient light component. The second read period Tr2 can also be set to a short value depending on the pulse duration of the pulsed light Lp, and the first read period Tr1 during which only ambient light Ls is read can be made equal to the second read period Tr2. Since the reading time can be shortened, the quantity of incident ambient light Ls can be reduced, so as to reduce the light shot noise caused by ambient light Ls.

The first discharge period Td1 between the first read period Tr1 and the second read period Tr2 can be set to a very short time length, e.g., the time length of the first read period Tr1, which is sufficient to discharge unwanted photoelectrons generated by the photodetector 112. Consequently, within a short time, it is possible to switch between reading of photoelectrons generated during a period (first read period Tr1) in which a pulsed light Lp is not radiated to the subject W (acquisition of a luminance value at a time when the subject W is not irradiated) and reading of photoelectrons generated during a period (second read period Tr2) in which a pulsed light Lp is radiated to the subject W (acquisition of a luminance value at a time when the subject W is irradiated). Thus, synchronism between acquisition of the luminance value when the subject is not irradiated and acquisition of the luminance value when the subject is irradiated can be significantly increased.

Figure 10:
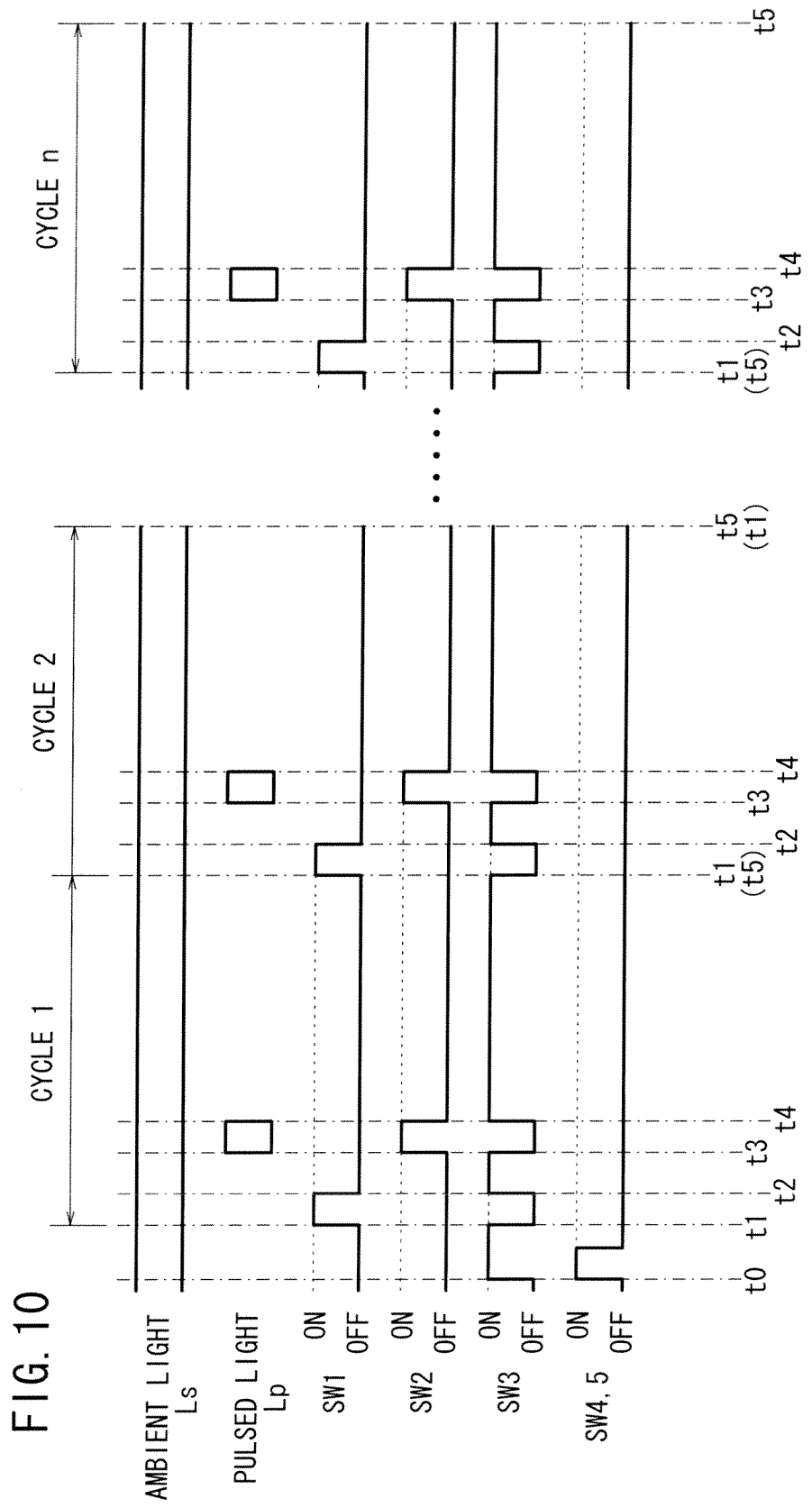
FIG. 10 is a timing chart of an operation sequence, for a plurality of repetitive cycles, of the light-detecting system according to the present embodiment.

If the above cycle is repeated a plurality of times, then, as shown in FIG. 10, the light-detecting system 100 operates according to the operation timing shown in FIG. 9, in each of cycle 1, cycle 2, . . . , and cycle n. At time t3 in each cycle, the control device 104 outputs a light emission command Sc to the drive pulse generating circuit 36 of the light-emitting device 10. The control device 104 outputs the light emission command Sc in cyclic periods, each of which represents a pulse period of the light pulse train output from the light-emitting device 10. In this case, the first output voltage Vout1 and the second output voltage Vout2 may be read only in the final cycle n. The amount of photoelectrons stored in the first capacitor C1 and the second capacitor C2 can thus be increased.

Since the duty ratio of the pulsed light Lp to the pulse period of the light pulse train is 1% or less (e.g., 0.1% or less), in this case as well, the power of each light pulse Lp included within the light pulse train can be made higher than continuous light, thereby greatly increasing the S/N ratio of reflected light Lr (signal light component) to ambient light Ls (noise component) in each pulse duration. Since photoelectrons are stored in each of the first capacitor C1 and the second capacitor C2 over a plurality of cycles, the signal light component is increased, thus making it possible to perform subsequent signal processing with high accuracy. In each of respective cycles, it is possible to switch, within a short time, between reading of photoelectrons generated during the first read period Tr1 (acquisition of a luminance value at a time when the subject W is not irradiated) and reading of photoelectrons generated during the second read period Tr2 (acquisition of luminance values at a time when the subject W is irradiated). Thus, synchronism between acquisition of the luminance value when the subject is not irradiated and acquisition of the luminance value when the subject is irradiated can be significantly increased.

In the above embodiment, the photodetector 112 comprises a pinned photodiode (FIG. 8). Alternatively, the photodetector 112 may comprise another type of photodetector, such as a photodiode other than a pinned photodiode, a photogate, or the like.

Figure 11:
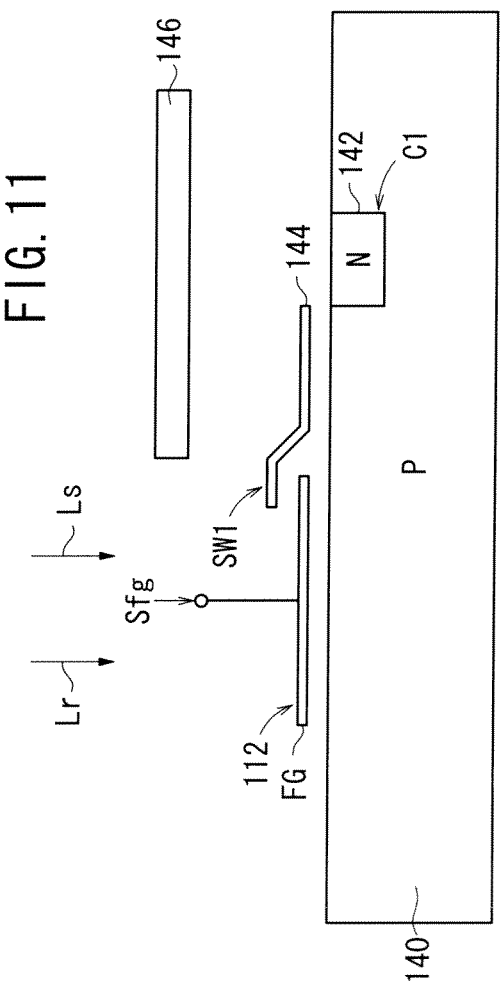
FIG. 11 is a cross-sectional view of the photodetector, which employs a photogate as the photodetector.

FIG. 11 is a partial vertical cross-sectional view showing a photodetector 112, which comprises a photogate FG, and a peripheral structure thereof.

As shown in FIG. 11, the photodetector 112 and the peripheral structure thereof include a P-type substrate 140, a photogate FG, an N-type semiconductor region 142, a transfer gate 144 in the form of a polysilicon layer, and a light shield 146 in the form of a metal layer or the like. The photogate FG makes up the photodetector 112. The gate drive circuit 122, although not shown in FIG. 11, is connected to the photogate FG. In response to a gate drive signal Sfg, which is applied to the photogate FG from the gate drive circuit 122, the photogate FG is selectively turned on and off, so as to vertically move the location at which photoelectrons are stored in the photodetector 112 (potential well). More specifically, when the photogate FG is turned on, the potential well is moved downwardly to facilitate storage of photoelectrons. Conversely, when the photogate FG is turned off, the potential well is moved upwardly in order to transfer all of the stored photoelectrons to another region (e.g., the first capacitor C1).

The substrate 140, the photogate FG, the semiconductor region 142, and the transfer gate 144 jointly make up the first switching element SW1 (the second switching element SW2 is omitted from illustration). The semiconductor region 142 also functions as a floating diffusion, and makes up the first capacitor C1 (the second capacitor C2 is omitted from illustration).

The light shield 146 is disposed in covering relation to the semiconductor region 142 and the transfer gate 144 for thereby blocking reflected light Lr and ambient light Ls from entering into the semiconductor region 142 and the transfer gate 144.

Figure 12:
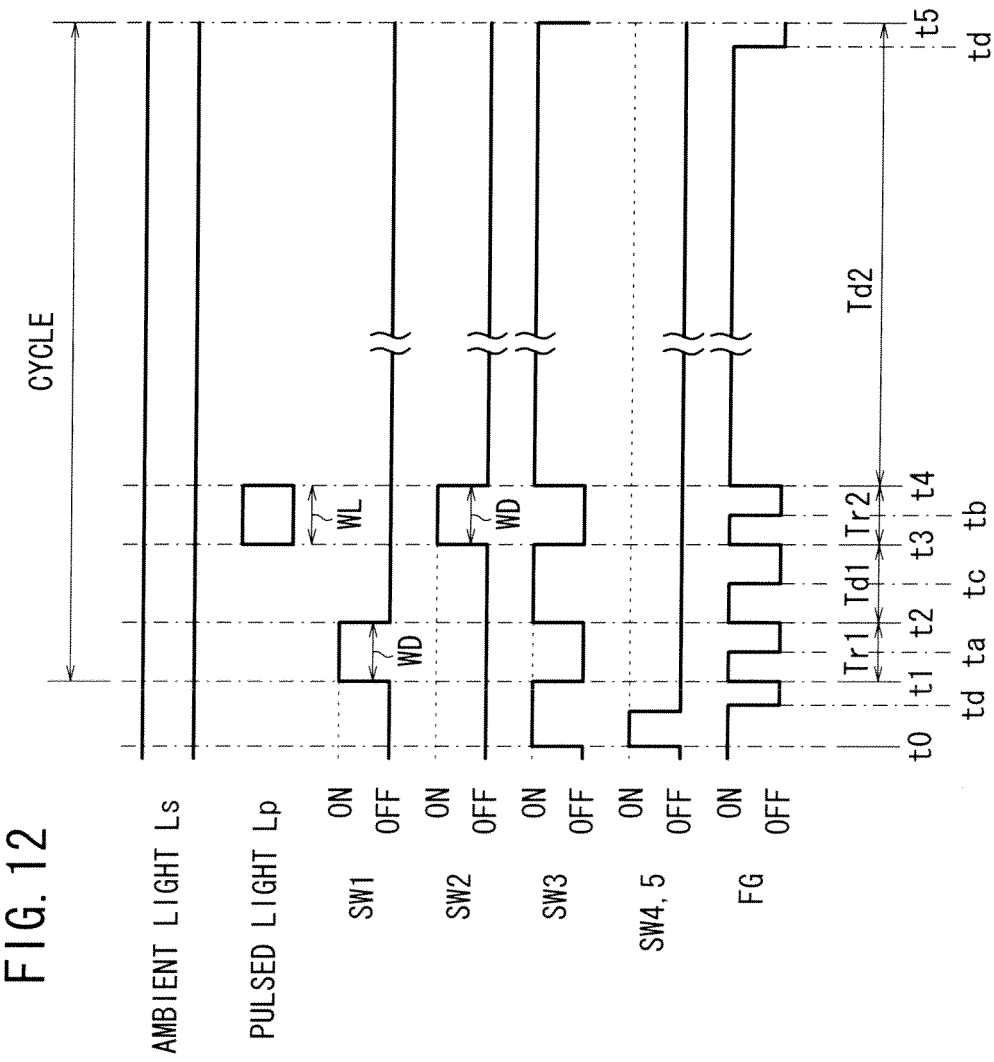
FIG. 12 is a timing chart of an operation sequence, for one cycle, of the light-detecting system with the photogate employed as the photodetector.

FIG. 12 illustrates an operation sequence of the light-detecting system 100, which employs the photogate FG as the photodetector 112. The timing chart shown in FIG. 12 is the same as the timing chart shown in FIG. 9, except for the timing of the photogate FG.

In FIG. 12, the photogate FG is turned on at time t1, at the start of the first read period Tr1, and is turned off at time to before time t2, at the end of the first read period Tr1. Therefore, photoelectrons generated by the photogate FG from ambient light Ls can quickly be transferred to the semiconductor region 142 (first capacitor C1). Similarly, the photogate FG is turned on at time t3, at the start of the second read period Tr2, and is turned off at time tb before time t4, at the end of the second read period Tr2. Therefore, photoelectrons generated by the photogate FG from ambient light Ls and reflected light Lr can quickly be transferred to another semiconductor region (second capacitor C2). The same process is performed in order to discharge unwanted photoelectrons. The photogate FG is turned on at times t2 and t4, at the start of the first discharge period Td1 and the second discharge period Td2, and is turned off at times tc and td before end times t3 and t5 (t1), thereby quickly discharging unwanted photoelectrons.

<Image Sensing System>

In the above embodiment, the photodetector 112 is used as the light detector 110 of the light-detecting device 102 in the light-detecting system 100. Alternatively, the light detector 110 may be a line sensor array, comprising a one-dimensional array of photodetectors 112 or an image sensor array comprising a two-dimensional array of photodetectors 112. In other words, an image sensing system may include the light detector 110, which is a line sensor array comprising a one-dimensional array of photodetectors 112 or an image sensor array comprising a two-dimensional array of photodetectors 112.

Figure 13:
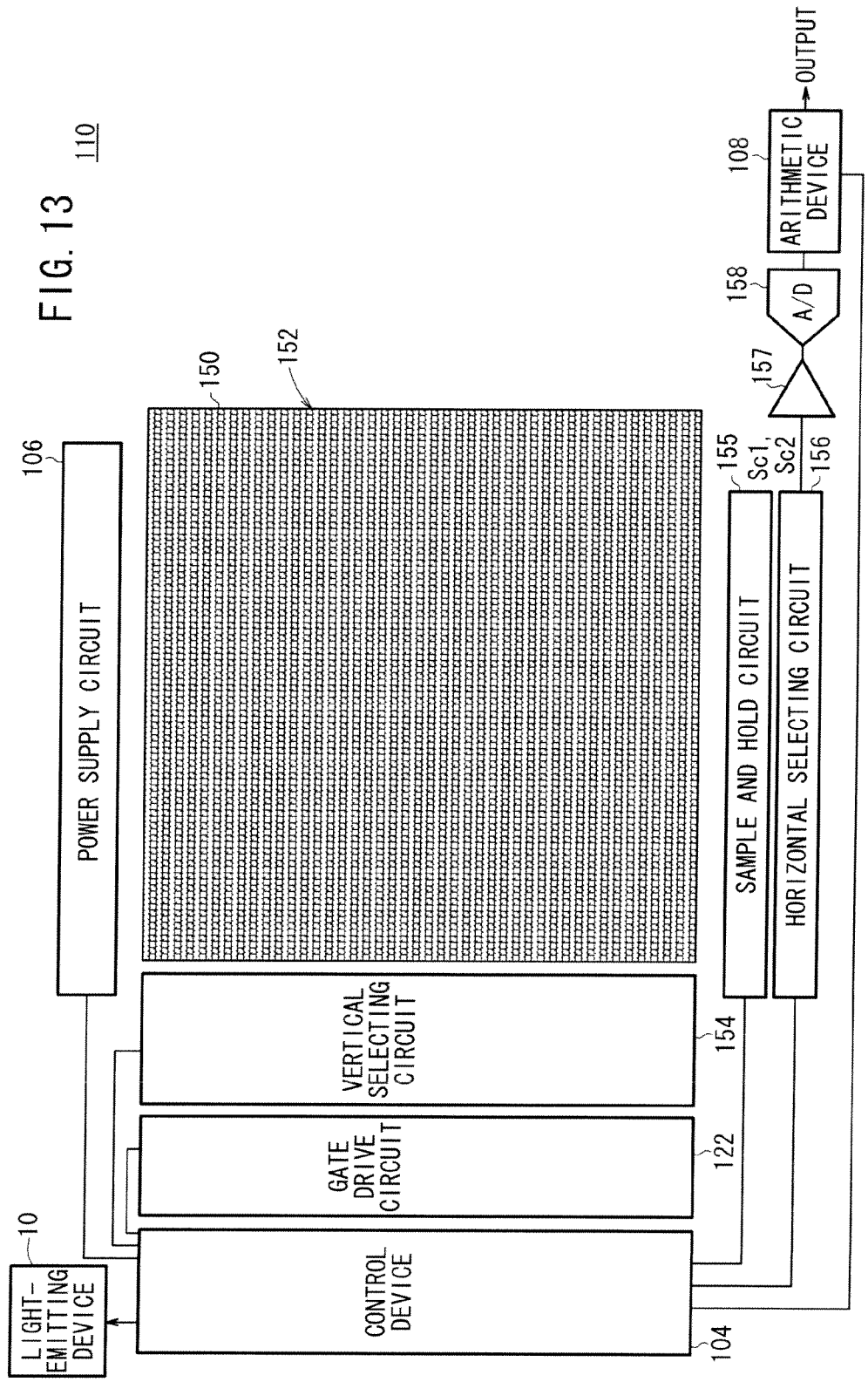
FIG. 13 is a diagram showing a photodetector having an image sensor array.

FIG. 13 is a diagram showing the light detector 110 in which an image sensor array is used. The light detector 110 comprises an image sensor array 152 made up of a matrix of pixels 150, a gate drive circuit 122, a vertical selecting circuit 154, a sample and hold circuit 155, a horizontal selecting circuit 156, an output buffer 157, and an A/D converter 158.

Figure 14:
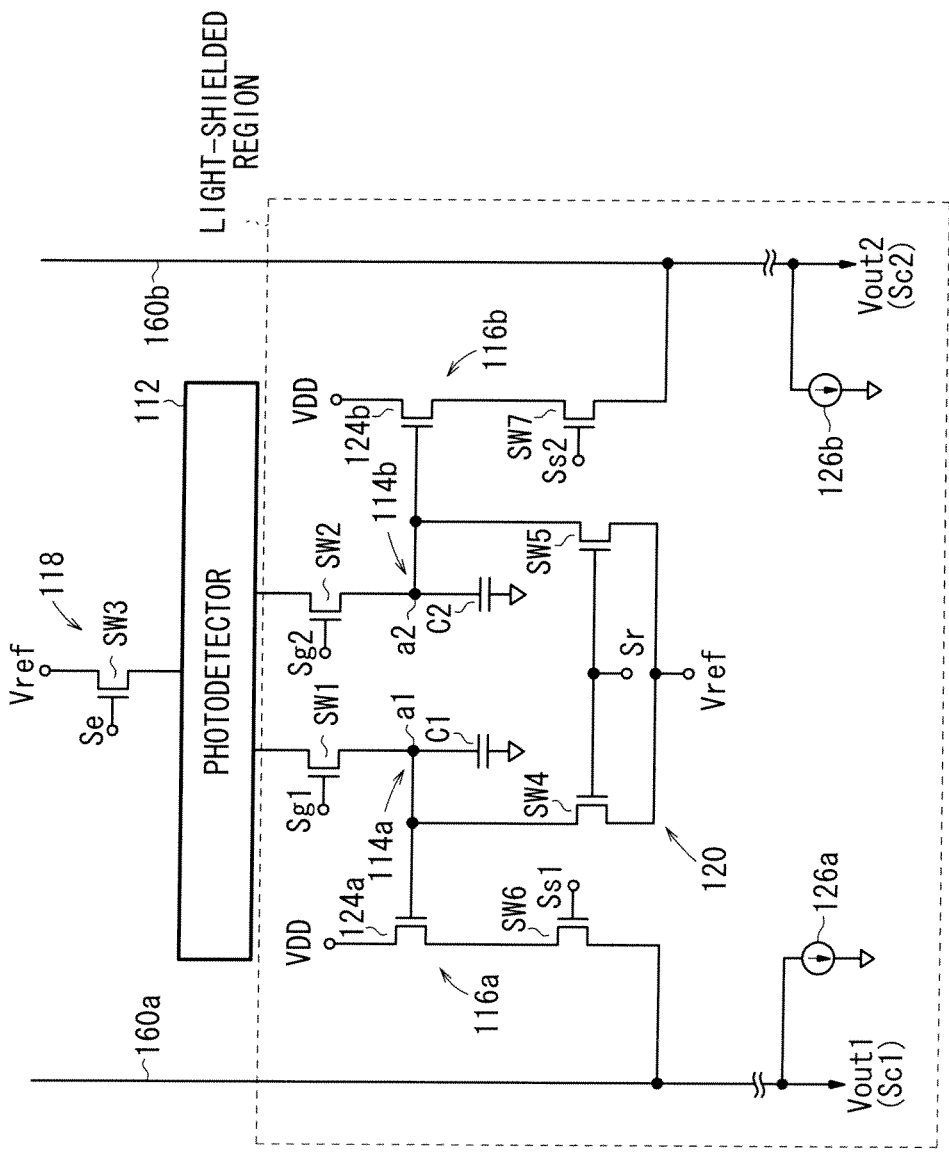
FIG. 14 is a circuit diagram showing the arrangement of each pixel in the image sensor array.

As shown in FIG. 14, each of the pixels 150 includes a photodetector 112, a first photoelectron storage unit 114a, a second photoelectron storage unit 114b, a first amplifier 116a, a second amplifier 116b, a photoelectron discharger 118, a resetting section 120, a first output line 160a, and a second output line 160b. The photodetector 112, the first photoelectron storage unit 114a, the second photoelectron storage unit 114b, the photoelectron discharger 118, and the resetting section 120 are identical to those of the light detector 110 (see FIG. 7) of the light-detecting system 100. The first amplifier 116a comprises a first output element 124a and a sixth switching element SW6 in the form of an re-channel MOS transistor, for example, connected between the source of the first output element 124a and the first output line 160a. The second amplifier 116b comprises a second output element 124b and a seventh switching element SW7 in the form of an n-channel MOS transistor, for example, connected between the source of the second output element 124b and the second output line 160b. A first current source 126a is connected between the first signal line 160a and ground (or a negative power supply), and a second current source 126b is connected between the second signal line 160b and ground (or a negative power supply). A first output voltage Vout1 is produced from the first signal line 160a, and a second output voltage Vout2 is produced from the second signal line 160b.

The image sensor array 152 outputs a first stored photoelectron signal Sc1 and a second stored photoelectron signal Sc2, which depend on the amount of reflected light Lr detected by the pixels 150, through the sample and hold circuit 155, the horizontal selecting circuit 156, the output buffer 157, and the A/D converter 158.

More specifically, the gate drive circuit 122 outputs gate drive signals (which refer collectively to a first read signal Sg1, a second read signal Sg2, a resetting signal Sr, and a photoelectron discharge signal Se), so as to selectively turn on and off the first through fifth switching elements SW1 through SW5. The vertical selecting circuit 154, which comprises a multiplexer (not shown), selectively outputs a first pickup signal Ss1 and a second pickup signal Ss2 to a row that contains a pixel 150 to be read, thereby enabling the pixel 150 to output a first stored photoelectron signal Sc1 (first output voltage Vout1) and a second stored photoelectron signal Sc2 (second output voltage Vout2). The horizontal selecting circuit 156, which comprises another multiplexer (not shown), selects a column that contains a pixel 150 to be read, thereby enabling the pixel 150 to output a first stored photoelectron signal Sc1 (first output voltage Vout1) and a second stored photoelectron signal Sc2 (second output voltage Vout2) to the arithmetic device 105 through the sample and hold circuit 155, the horizontal selecting circuit 156, the output buffer 157, and the A/D converter 158. When the arithmetic device 105 receives the first stored photoelectron signal Sc1 and the second stored photoelectron signal Sc2, the arithmetic device 105 determines a reflected light intensity from the first stored photoelectron signal Sc1 and the second stored photoelectron signal Sc2.

The image sensing system is capable of increasing the S/N ratio, reducing the effect of noise components due to ambient light, and increasing synchronism between acquisition of a luminance value when the object is irradiated and acquisition of a luminance value when the object is not irradiated. Hence, the image sensing system can be used in various applications that make use of light emission.

In the above image sensing system, light emitted from the light-emitting device has a wavelength, which is equal to or greater than 700 nm and less than 1050 nm. Therefore, assuming that infrared radiation is used, the image sensing system can be realized as a night-vision image sensing system.

The invention claimed is:

1. A light-detecting system comprising:
a light-emitting device for irradiating a subject with light;
a light-detecting device for detecting reflected light from the subject; and
a control device for controlling the light-emitting device and the light-detecting device,
wherein the light-emitting device comprises:
a diffused light source having a light emission surface, the longest side of which has a length of 1.5 mm or greater; and
a drive circuit for supplying drive pulses to the diffused light source in response to a light emission command input thereto in a constant cyclic period, to enable the diffused light source to emit at least two pulsed lights intermittently;
wherein the diffused light source comprises a plurality of semiconductor laser bars each having a linear array of light-emission regions, the semiconductor laser bars being stacked together;
heat radiating plates interposed between the semiconductor laser bars, an anode terminal plate mounted on one of the semiconductor laser bars, which is positioned at an end of the diffused light source, and a cathode terminal plate mounted on one of the semiconductor laser bars, which is positioned at an opposite end of the diffused light source; and wherein a drive circuit is provided to drive such that:
the pulsed lights emitted from the diffused light source have a pulse duration longer than 1 nanosecond and shorter than 0.25 second;
a single pulse of the pulsed lights has a light energy less than 66.8 μ[J];
the constant cyclic period exceeds 18 μsec;
the at least two pulsed lights make up a light pulse train having an average energy less than 3.75 μ[J];
the pulsed lights have an average power less than 74.0 m[W]; and
the duty ratio of the pulsed lights to the constant cyclic period is 1% or less;
wherein the light-detecting device comprises:
a photodetector for detecting the reflected light and generating photoelectrons by the detected reflected light;
a first capacitor and a second capacitor for storing the photoelectrons from the photodetector;
a photoelectron discharger for discharging the photoelectrons from the photodetector; and
a first switching element, a second switching element, and a third switching element for selectively allocating the photoelectrons from the photodetector to the first capacitor, the second capacitor, and the photoelectron discharger in synchronization with driving of the light-emitting device; and
wherein the control device turns on the first switching element to transfer the photoelectrons from the photodetector to the first capacitor during a first period that resides within a period in which the pulsed lights are not emitted from the light-emitting device;
turns on the second switching element to transfer the photoelectrons from the photodetector to the second capacitor during a second period that resides within a period in which the pulsed lights are emitted from the light-emitting device;
turns on the third switching element to discharge the photoelectrons from the photodetector to the photoelectron discharger during a period other than the first period and the second period; and
acquires luminance information of the reflected light independent of ambient light, based on a difference between a photoelectron quantity transferred to the first capacitor and a photoelectron quantity transferred to the second capacitor,
wherein a combination of the first period and the second period is intermittently repeated a plurality of times;
the photoelectrons from the photodetector are transferred to and stored in the first capacitor during the first period, which is repeated a plurality of times;
the photoelectrons from the photodetector are transferred to and stored in the second capacitor during the second period, which is repeated a plurality of times; and
luminance information of the reflected light independent of the ambient light is acquired based on the difference between a photoelectron quantity transferred to and stored in the first capacitor and a photoelectron quantity transferred to and stored in the second capacitor.

2. The light-emitting device according to claim 1, wherein the light emission surface of the diffused light source is combined with a light diffusing member for controlling at least a range irradiated with light or a bright spot area of light emitted from the light-emitting device.

3. The light-emitting device according to claim 2, wherein the light diffusing member comprises a diffusing plate with a hologram pattern formed thereon.

4. The light-detecting system according to claim 1, wherein the photodetector comprises a photodiode, a pinned photodiode, or a photogate.

5. The light-detecting system according to claim 1, wherein each of the first capacitor and the second capacitor comprises a MIM capacitor, a MOS capacitor, or a parasitic capacitance of a pinned photodiode structure or a pn junction.

6. The light-detecting system according to claim 1, wherein at least the first switching element, the second switching element, the third switching element, the first capacitor, and the second capacitor are disposed in a light-shielded region.

7. The light-detecting system according to claim 1, further comprising a power supply and a resetting switch for resetting the potentials of the first capacitor and the second capacitor at a reset potential.

8. The light-detecting system according to claim 1, further comprising:
a first amplifier including a first gate terminal to which a potential based on the photoelectron quantity stored in the first capacitor is applied, wherein the first amplifier converts the potential applied to the first gate terminal into a voltage signal; and
a second amplifier including a second gate terminal to which a second potential based on the photoelectron quantity stored in the second capacitor is applied, wherein the second amplifier converts the potential applied to the second gate terminal into a voltage signal.

9. The light-detecting system according to claim 1, wherein the anode terminal plate and the cathode terminal plate are electrically connected to the drive circuit.

10. An image sensing system comprising:
a light-emitting device; and
a line sensor array or a two-dimensional image sensor array including an array of pixels,
wherein the light-emitting device comprises:
a diffused light source having a light emission surface, the longest side of which has a length of 1.5 mm or greater; and
a drive circuit for supplying drive pulses to the diffused light source in response to a light emission command input thereto in a constant cyclic period, to enable the diffused light source to emit at least two pulsed lights intermittently;
wherein the diffused light source comprises a plurality of semiconductor laser bars each having a linear array of light-emission regions, the semiconductor laser bars being stacked together;
heat radiating plates interposed between the semiconductor laser bars, an anode terminal plate mounted on one of the semiconductor laser bars, which is positioned at an end of the diffused light source, and a cathode terminal plate mounted on one of the semiconductor laser bars, which is positioned at an opposite end of the diffused light source; and
wherein a drive circuit is provided to drive such that:
the pulsed lights emitted from the diffused light source have a pulse duration longer than 1 nanosecond and shorter than 0.25 second;
a single pulse of the pulsed lights has a light energy less than 66.8 μ[J];
the constant cyclic period exceeds 18 μsec;
the at least two pulsed lights make up a light pulse train having an average energy less than 3.75 μ[J];
the pulsed lights have an average power less than 74.0 m[W]; and the duty ratio of the pulsed lights to the constant cyclic period is 1% or less, wherein a light-detecting device for detecting reflected light from a subject is further provided, the light-detecting device comprising:

a photodetector for detecting the reflected light and generating photoelectrons by the detected reflected light;

a first capacitor and a second capacitor for storing the photoelectrons from the photodetector;

a photoelectron discharger for discharging the photoelectrons from the photodetector; and a first switching element, a second switching element, and a third switching element for selectively allocating the photoelectrons from the photodetector to the first capacitor, the second capacitor, and the photoelectron discharger in synchronization with driving of the light-emitting device; and wherein a unit, which includes at least the photodetector, the first capacitor, the second capacitor, the first switching element, and the second switching element of the light-detecting device, provides components of a pixel of the line sensor array or the two-dimensional image sensor array.

11. The image sensing system according to claim 10, wherein the light detected by the light-detecting device has a wavelength, which is equal to or greater than 700 nm and less than 1050 nm.

12. The image sensing system according to claim 10, wherein the anode terminal plate and the cathode terminal plate are electrically connected to the drive circuit.

* * * * *